(12) United States Patent
Kao et al.

(10) Patent No.: US 8,098,099 B2
(45) Date of Patent: Jan. 17, 2012

(54) BROADBAND HIGH OUTPUT CURRENT OUTPUT STAGE

(75) Inventors: Min-Sheng Kao, Taipei County (TW);
Jen-Ming Wu, Hsinchu County (TW);
Yu-Hao Hsu, Tainan County (TW)

(73) Assignee: National Tsing Hua University, Hsin-Chu (TW)

( * ) Notice: Subject to any disclaimer, the term of this patent is extended or adjusted under 35 U.S.C. 154(b) by 58 days.

(21) Appl. No.: 12/797,646

(22) Filed: Jun. 10, 2010

(65) Prior Publication Data
US 2010/0315165 A1    Dec. 16, 2010

(30) Foreign Application Priority Data

Jun. 11, 2009  (TW) ................................ 98119604 A (51) Int. Cl.
*H03F 3/45*   (2006.01)
(52) U.S. Cl. ......... 330/260; 330/302; 330/261; 330/311
(58) Field of Classification Search .................. 330/260, 330/302, 261, 311
See application file for complete search history.

(56) References Cited

U.S. PATENT DOCUMENTS

| 6,924,701 B1 * | 8/2005  | Bhandari  | 330/252 |
| 6,963,246 B2 * | 11/2005 | Sugimura  | 330/260 |
| 7,113,039 B2 * | 9/2006  | Zanchi    | 330/252 |
| 7,633,344 B2 * | 12/2009 | Yamaguchi | 330/291 |

* cited by examiner

*Primary Examiner* — Patricia Nguyen
(74) *Attorney, Agent, or Firm* — WPAT, P.C.; Anthony King (57) ABSTRACT

A broadband high output current output stage includes at least one first differential pair for enhancing the bandwidth. A second differential pair is further disposed in the circuit. The second differential pair is coupled to one of the first differential pair, such that a large output voltage swing is distributed to all transistors to avoid breakdowns thereof. A feedback unit is connected between each bias unit and the first differential pair. The first compensation unit compensates the electric characteristic of the high-frequency zero of the feedback unit and the bias unit, thereby broadening the linear bandwidth of the frequency response. The second compensation units are disposed between the first differential pairs. Each second compensation unit compensates the high-frequency zero of the node where each two first differential pairs are cascaded, thereby further broadening the linear bandwidth of the frequency response.

18 Claims, 11 Drawing Sheets

BROADBAND HIGH OUTPUT CURRENT OUTPUT STAGE

BACKGROUND OF THE INVENTION

1. Field of the Invention

The present invention relates to an optical communication system, in particular to a broadband high output current output stage applied in a low-cost manufacturing process to achieve the effect of improving the communication capacity.

2. Description of the Related Art

At present, optical communication technology is the mainstream of the high-speed communication network and a middle-distance signal transmission of the optical communication technology generally adopts a direct modulation distributed feedback (DFB) laser light source, and a long-distance signal transmission adopts an external modulation laser (EML) light source. As to the transmission rate, present system manufacturers adopt a mature network technology, namely a coarse wavelength division multiplexing (CWDM) technology having a primary technical specification of OC48 (2.488 Gb/s)~OC192 (9.953 Gb/s), and gradually advancing to OC768 (39.812 Gb/s).

Figure 1:
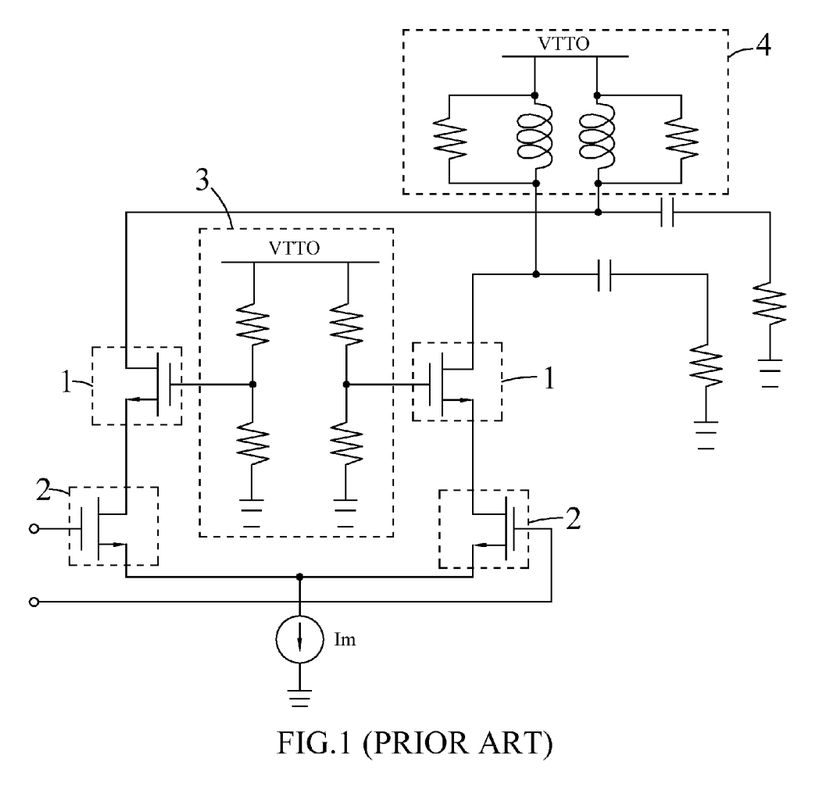
FIG. 1 is a schematic circuit diagram of a high output current output stage produced by a conventional CMOS process.

With reference to FIG. 1 for a high output current output stage produced by a CMOS process, the output stage comprises a first differential pair 1, a second differential pair 2 and a bias unit 3, wherein the first differential pair 1 is connected to a load 4 and the second differential pair 2 respectively, and the second differential pair 2 is connected to a previous driver (pre-driver) for a high current output, and the bias unit 3 is connected to the first differential pair 1. The output stage still cannot meet the bandwidth requirement of 40 Gb/s. In another high output current output stage produced by an indium phosphide (InP) and gallium arsenide (GaAs) process, the bandwidth requirement of 40 Gb/s can be met, but the cost is high, and the mass production is difficult.

SUMMARY OF THE INVENTION

It is a primary objective of the present invention to overcome the shortcomings of the prior art by providing a high output current output stage to solve the issue of a conventional high output current output stage which is not applicable for a mass production with a low-cost manufacturing process.

To achieve the foregoing objective of the present invention, the invention provides a high output current output stage, comprising: a first differential pair, a second differential pair, a bias unit, a feedback unit and a first compensation unit, wherein the first differential pair is connected to the second differential pair and also connected to a load, and is capable of improving the bandwidth of the circuit. In addition, the second differential pair is connected to a previous driver for a high current output, and the bias unit is connected to the first differential pair through the first compensation unit for providing a bias required by the first differential pair, and the feedback unit is connected between the bias unit and the first differential pair, and the feedback unit transmits a portion of output signals back to the first differential pair to enhance a gain and its linearity of the circuit. In the meantime, the first compensation unit is provided for compensating the electric characteristic of the high-frequency zero for the feedback unit and the bias unit, thereby broadening the linear bandwidth of the frequency response.

To achieve the objective of the present invention, the invention provides another high output current output stage, comprising a plurality of stacked first differential pairs, a second differential pair, a plurality of bias units, a first compensation unit, a feedback unit and a second compensation unit, wherein the first differential pairs may increase the bandwidth of the whole circuit, and the uppermost differential pair of the first differential pairs is provided for connecting a load, and the lowermost differential pair of the first differential pair is provided for connecting the second differential pair, and the second differential pair is connected to a previous driver for outputting a high current. In addition, each bias unit is connected to each of the first differential pairs through each of the first compensation units to provide a bias voltage respectively to the first differential pair, and each feedback unit is disposed between each bias unit that is connected with each first compensation unit and each first differential pair for enhancing a gain and its linearity of the circuit, and each first compensation unit compensates the electric characteristic of a high-frequency zero for the feedback unit and the bias unit, thereby broadening the linear bandwidth of the frequency response. And, a second compensation unit disposed between each of the first differential pairs is provided for compensating the electric characteristic of the high frequency zero between each of the first differential pairs, thereby further broadening the linear bandwidth of the frequency response.

In summation of the description above, the high output current output stage of the present invention has the following advantages:

(1) The output stage can output a large current to increase its bandwidth.

(2) The output stage can use a matured stable 0.18 μm or 0.13 μm CMOS chip fabrication process for its production.

DETAILED DESCRIPTION OF THE PREFERRED EMBODIMENTS

Figure 2:
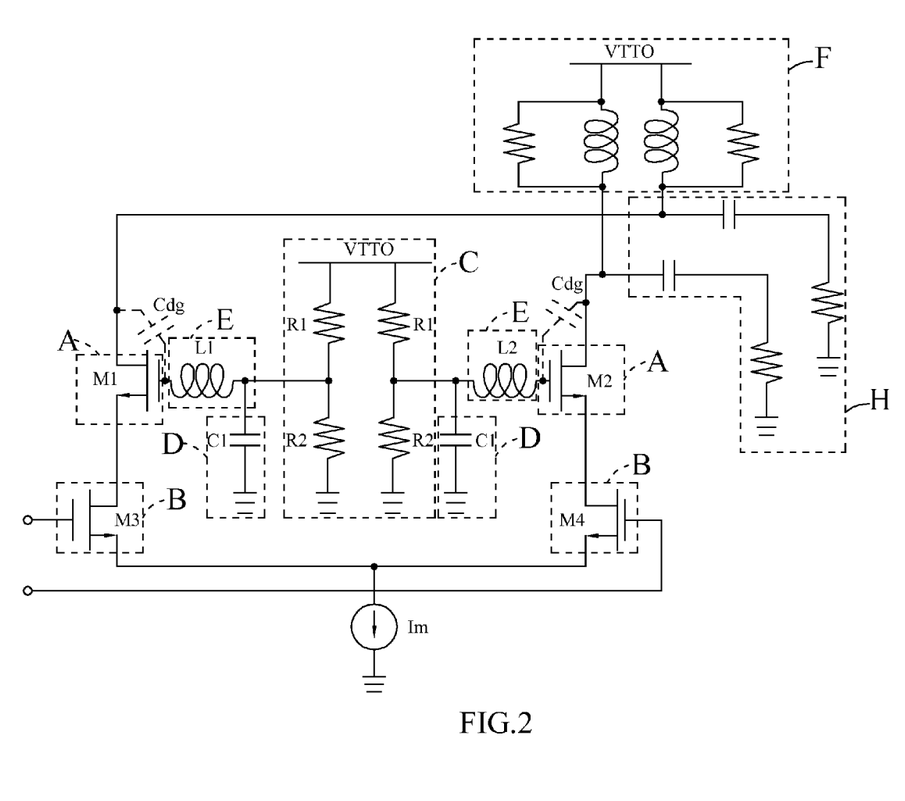
FIG. 2 is a schematic circuit diagram of a broadband high output current output stage in accordance with the present invention.

With reference to FIG. 2 for a schematic circuit diagram of a broadband high output current output stage in accordance with the present invention; the output stage comprises a first differential pair A, a second differential pair B, a bias unit C, a feedback unit D and a first compensation unit E, wherein the first differential pair A comprises a first transistor M1 and a second transistor M2, and a first drain of the first transistor M1 is connected to an terminal of a load F, and a second drain of the second transistor M2 is connected to another terminal of the load F, and the first gate of the first transistor M1 and the second gate of the second transistor M2 are connected to a bias unit C through the first compensation unit E, such that the first transistor M1 and the second transistor M2 are formed a common gate status and the first differential pair A is capable of enhancing a bandwidth.

The second differential pair B comprises a third transistor M3 and a fourth transistor M4, wherein a first source of the first transistor M1 is connected to a third drain of the third transistor M3, and a second source of the second transistor M2 is connected to a fourth drain of the fourth transistor M4, such that the third transistor M3 and the fourth transistor M4 are formed a common source status, and the third source of the third transistor M3 and the fourth source of the fourth transistor M4 are connected to each other, and the third gate of the third transistor M3 and the fourth gate of the fourth transistor M4 are connected to a pre-driver, for scatterly distributing a large output voltage swing outputted from a power source terminal to all transistors to avoid breakdowns of the transistors.

Figure 3:
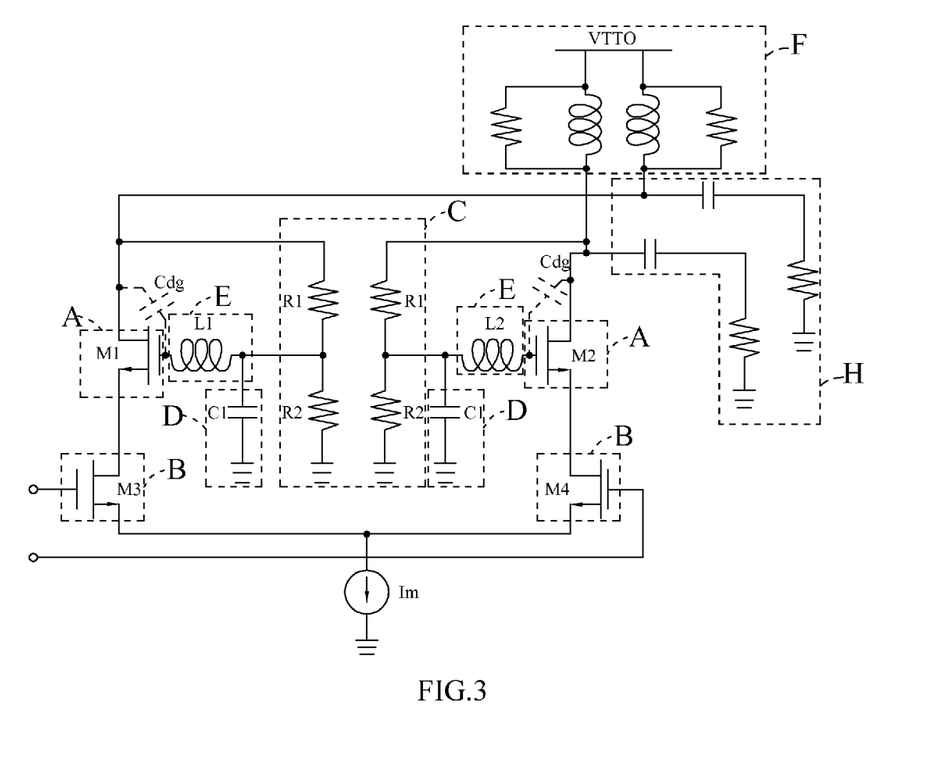
FIG. 3 is a schematic circuit diagram of a connection of a bias unit of a broadband high output current output stage in accordance with the present invention.
Figure 4:
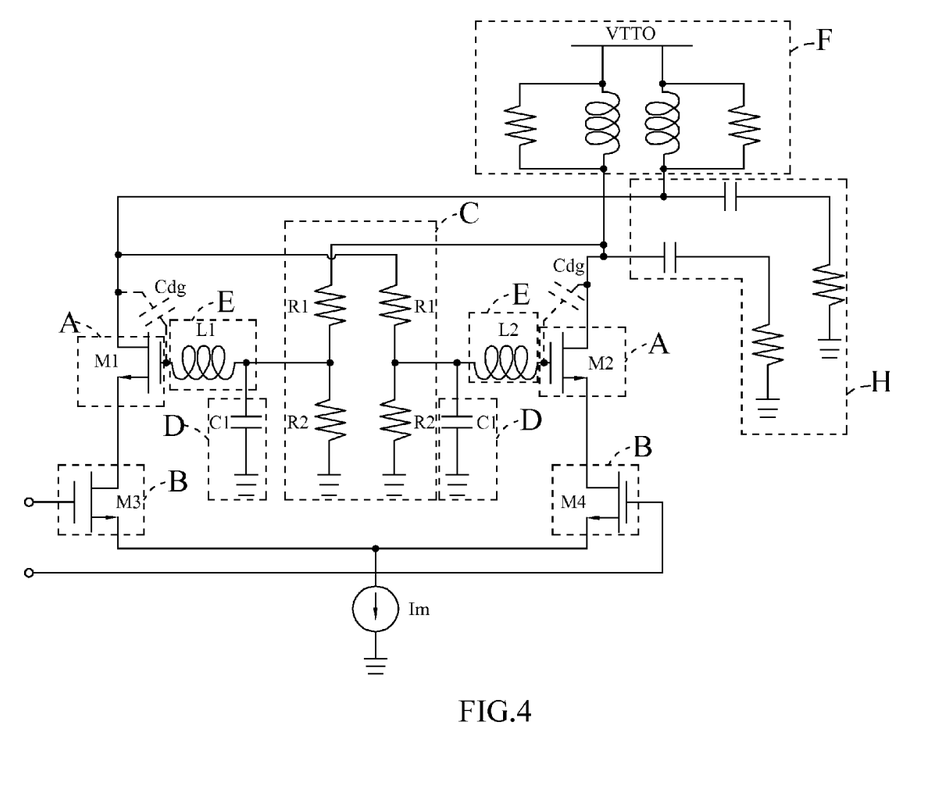
FIG. 4 is a schematic circuit diagram of another connection of a bias unit of a broadband high output current output stage in accordance with the present invention.

The bias unit C includes two pairs of serially connected first resistor R1 and second resistor R2, wherein one end of each first resistor R1 is connected to one terminal of a voltage source, and one end of each second resistor R2 is connected to the ground. With reference to FIGS. 3 and 4 for schematic circuit diagrams of connecting a bias unit of a broadband high output current output stage of the present invention, one end of each first resistor R1 is connected to the first drain of the first transistor M1 or the second drain of the second transistor M2.

The feedback unit D is disposed between the bias unit C and the first differential pair A, and can be a capacitor C1, and a parasitic capacitor Cdg is generated according to electric characteristic of the first transistor M1 and the second transistor M2, the capacitor C1 and the parasitic capacitor Cdg may provided for returning a portion of output signals back to the first differential pair A for enhancing a gain and its linearity of the output stage.

The first compensation unit E comprises a first inductor L1 and a second inductor L2, wherein a first end of the first inductor L1 is connected to the first gate of the first transistor M1, and a second end of the first inductor L1 is connected to a first connection point where a pair of first resistor R1 and second resistor R2 is connected. A third end of the second inductor L2 is connected to a second gate of the second transistor M2, and a fourth end of the second inductor L2 is connected to a second connection point where another pair of first resistor R1 and second resistor R2 is connected. If the circuit is operated at a high frequency, the capacitor C1 will have an increasingly smaller impedance value. Now, the first inductor L1 and the second inductor L2 may provided for compensating the impedance value of the capacitor C1, which means compensating the electric characteristic of the high frequency zero of the capacitor C1, thereby broadening the linear bandwidth of the frequency response.

The bias unit C provides a bias voltage to the first differential pair of the first transistor M1 and the second transistor M2 through the first compensation unit E, and a feedback path is generated through the capacitor C1 and the parasitic capacitor Cdg, and the feedback path may provided for returning a portion of output signals to the first transistor M1 and the second transistor M2, such that the output terminal can achieve a synergetic effect. In addition, the first compensation unit E compensates an electric characteristic of the high frequency zero of the first capacitor C1, and each transistor M1~M4 scatterly distributes a large output voltage swing, so that the output stage can output a large current, increase the bandwidth, and use a mature stable 0.18 μm or 0.1.3 μm CMOS chip fabrication process to complete manufacturing the circuit of the present invention, so as to replace the high-priced indium phosphide (InP) and gallium arsenide (GaAs) process to lower the production cost.

Figure 5:
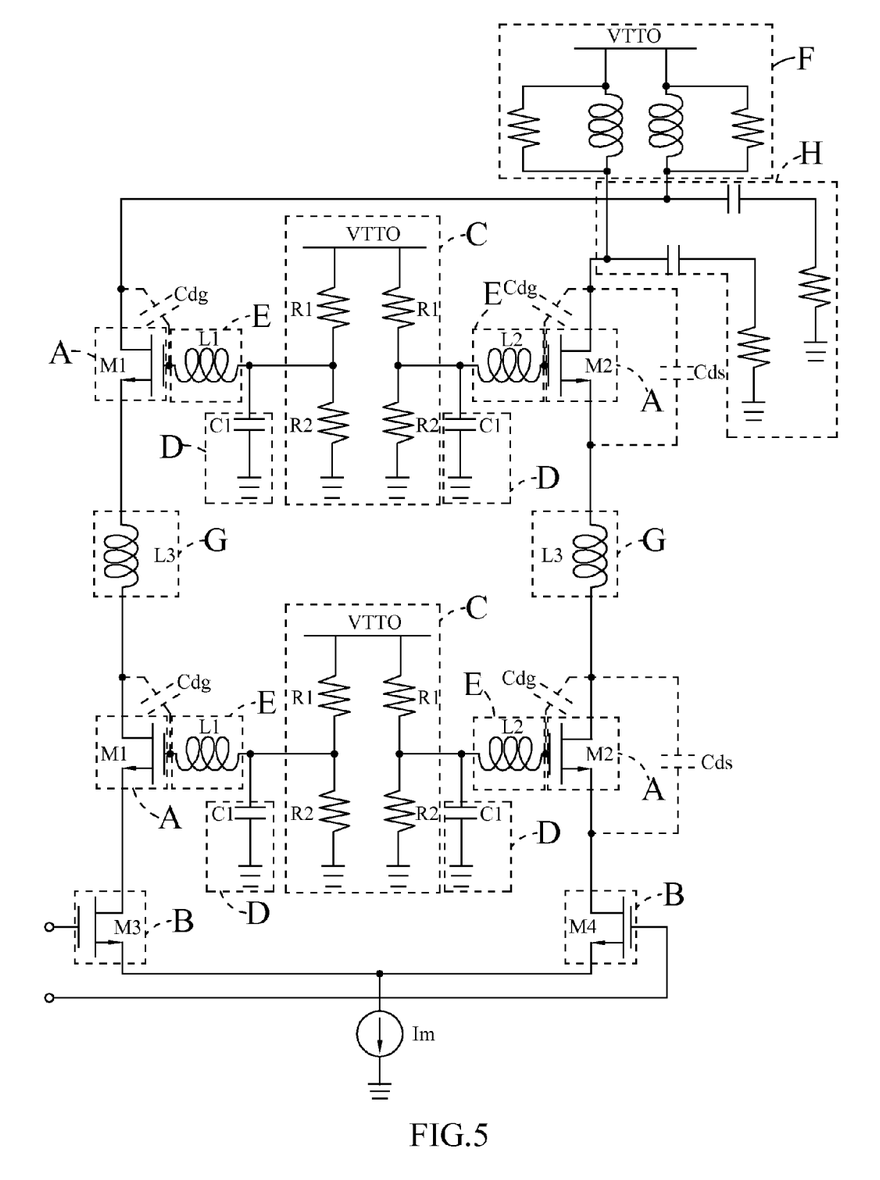
FIG. 5 is a schematic circuit diagram of a broadband high output current output stage in accordance with a first preferred embodiment of the present invention.

With reference to FIG. 5 for a schematic circuit diagram of a broadband high output current output stage in accordance with a first preferred embodiment of the present invention, the output stage comprises a first differential pair A, a second differential pair B, a bias unit C, a feedback unit D, a first compensation unit E and a second compensation unit G, wherein each first differential pair A comprises a first transistor M1 and a second transistor M2, and a first drain of the first transistor M1 of the uppermost pair is connected to a first terminal of the load F, and a first drain of the second transistor M2 of the uppermost pair is connected to a second terminal of the load F, and the first gate of each first transistor M1 and the second gate of each second transistor M2 are connected to a bias unit C through the first compensation unit E, such that the first transistor M1 and second transistor M2 of each first differential pair A form a common gate status.

The second differential pair B comprises a third transistor M3 and a fourth transistor M4, and a third drain of the third transistor M3 is connected to a first source of the first transistor M1 of the lowermost pair of the first differential pairs, and a fourth drain of the fourth transistor M4 is connected to a second source of a second transistor M2 of the lowermost pair of the first differential pairs, such that the third transistor M3 and the fourth transistor M4 are in a common source status, and the third gate of the third transistor M3 and the fourth gate of the fourth transistor M4 are connected to a previous driver. In addition, the third source of the third transistor M3 and the fourth source of the fourth transistor M4 are connected with one another, so that a large output voltage swing outputted from a power source terminal is scatterly distributed to all transistors to avoid breakdowns of the transistors, and the first differential pair A of such common gate has a high bandwidth effect.

Each bias unit C includes two pairs of serially connected first resistor R1 and second resistor R2, wherein one end of each first resistor R1 is connected to one terminal of a voltage source, and one end of each second resistor R2 is connected to the ground, and each bias unit C provides a bias voltage required by each first differential pair A through each first compensation unit E.

Each feedback unit D is disposed between each bias unit C and its corresponding first differential pair A, and each feedback unit D can be a capacitor C1, and a parasitic capacitor Cdg may be produced according to an electric characteristic through the first transistor M1 and the second transistor M2. The feedback path is provided with the capacitor C1 and the parasitic capacitor Cdg, and then a portion of output signals may be returned to each first differential pair A, so as to enhance a gain and its linearity of the circuit.

Each first compensation unit E comprises a first inductor L1 and a second inductor L2, wherein the first end of each first inductor L1 is connected to a first gate of the first transistor ML and the second end of each first inductor L1 is connected to the first connection point where a first pair of the two of the first resistor R1 and the second resistor R2 is connected. A third end of the second inductor L2 is connected to a second gate of the second transistor M2, and a fourth end of the second inductor L2 is connected to a second connection point where a second pair of the two pairs of the first resistor R1 and the second resistor R2 is connected, such that if the circuit gradually increases its bandwidth, each first inductor L1 and second inductor L2 will compensate the electric characteristics of the high frequency zero of each feedback unit D and the bias unit C, thereby broadening the linear bandwidth of the frequency response.

Each second compensation unit G may be the inductor L3, wherein one end of a inductor L3 is connected between the first source of first transistor M1 of the upper-layer differential pair and the first drain of the first transistor M1 of the lower-layer pair, and one end of another inductor L3 is connected between the second source of the second transistor M2 of the upper-layer differential pair and the second drain of the second transistor M2 of the lower-layer differential pair. The parasitic capacitor Cds may be generated according to the electric characteristics between the drain and the source of the transistor. Each second compensation unit G compensates the electric characteristic of the high frequency zero between each first differential pair A, thereby further broadening the linear bandwidth of the frequency response.

Therefore, the circuit achieves the effects of increasing the bandwidth to fit a mature stable CMOS process and providing better gain and its linearity. In addition, the circuit has more transistors for a better scatterly distributed effect of the large output voltage swing.

Figure 6:
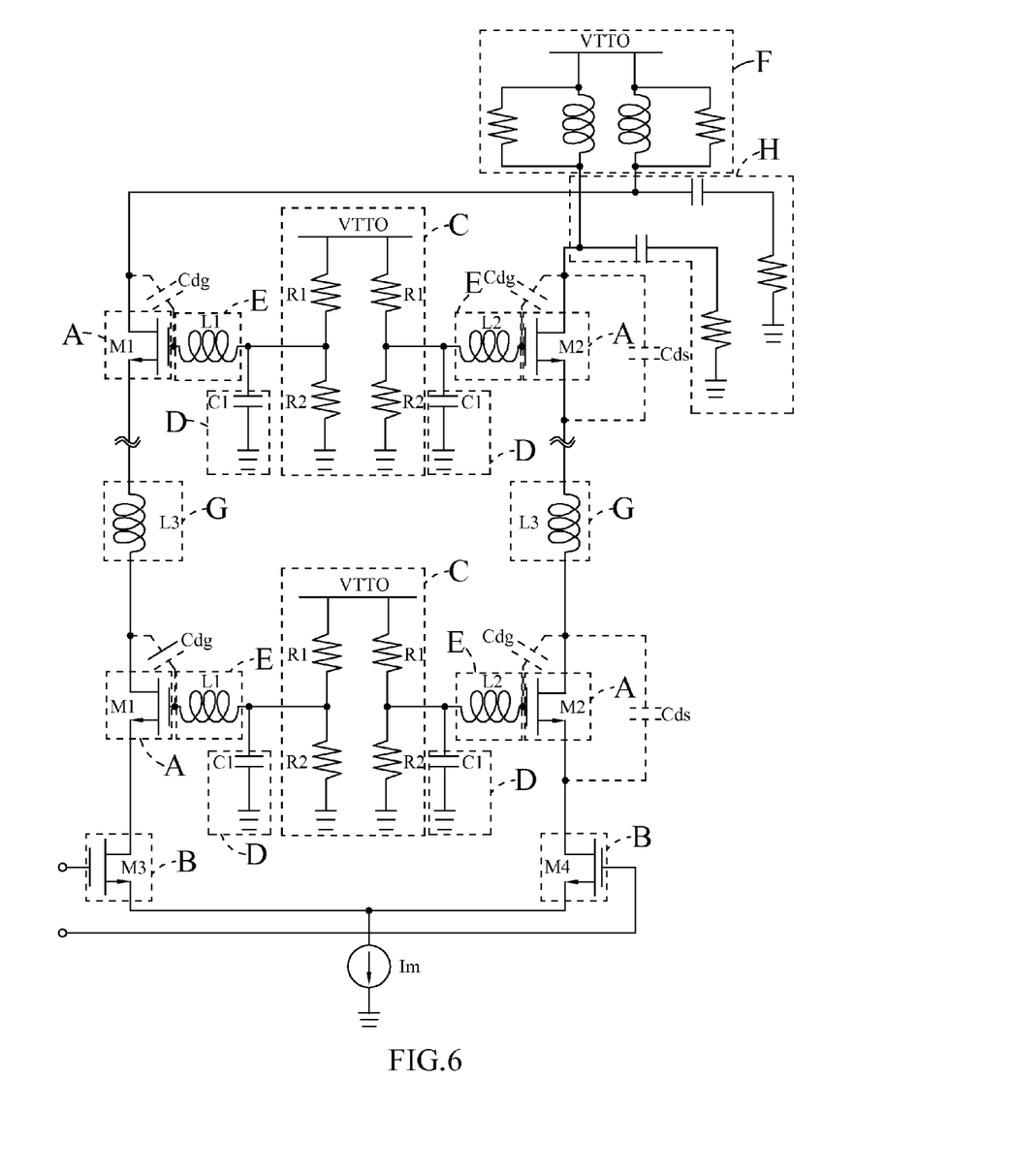
FIG. 6 is a schematic circuit diagram of a broadband high output current output stage in accordance with a second preferred embodiment of the present invention.

With reference to FIG. 6 for a schematic circuit diagram of a broadband high output current output stage in accordance with a second preferred embodiment of the present invention, this preferred embodiment is similar to the first preferred embodiment with the following exceptions:

1. The second preferred embodiment of the present invention includes two or more first differential pairs A, wherein a first drain of the first transistor M1 of the uppermost differential pair is connected to one terminal of a load F, and a second drain of the second transistor M2 of the uppermost differential pair is connected to another terminal of the load F.

2. The second preferred embodiment of the present invention comprises a second differential pair B and the second differential pair comprises a third transistor M3 and a fourth transistor M4. Wherein a third drain of the third transistor M3 is connected to a first source of the first transistor M1 of the lowermost differential pair, and a fourth drain of the fourth transistor M4 is connected to a second source of the second transistor M2 of the lowermost differential pair, and the third source of the third transistor M3 and the fourth source of the fourth transistor M4 are connected with each other, such that a large output voltage swing outputted from a power source terminal can be scatterly distributed onto more transistors to avoid breakdowns of the transistors.

3. The second preferred embodiment of the present invention includes a second compensation unit G disposed at a stacked position between each first transistor M1 and each second transistor M2; and each second compensation unit G comprises two inductors L3, and one of the inductors L3 in each second compensation unit G is disposed between a first source of the first transistor M1 of the upper-layer differential pair and a first drain of the first transistor M1 of the lower-layer differential pair, and another inductor L3 of each second compensation unit G is connected between a second source of the second transistor M2 of the upper-layer differential pair and a second drain of the second transistor M2 of the lower-layer differential pair. Thereby the electric characteristic of the high frequency zero between each first differential pair A is compensated, and the linear bandwidth of the frequency response is further broadened.

In all preferred embodiments of the present invention, the equivalent circuit of the load F can be a pair of parallely connected inductor-resistor circuits, and each terminal of such equivalent circuit is connected between the first differential pair A and connected separately to a discharge unit H, and the discharge unit H may be a circuit having a capacitor connected with a resistor in series.

Figure 7:
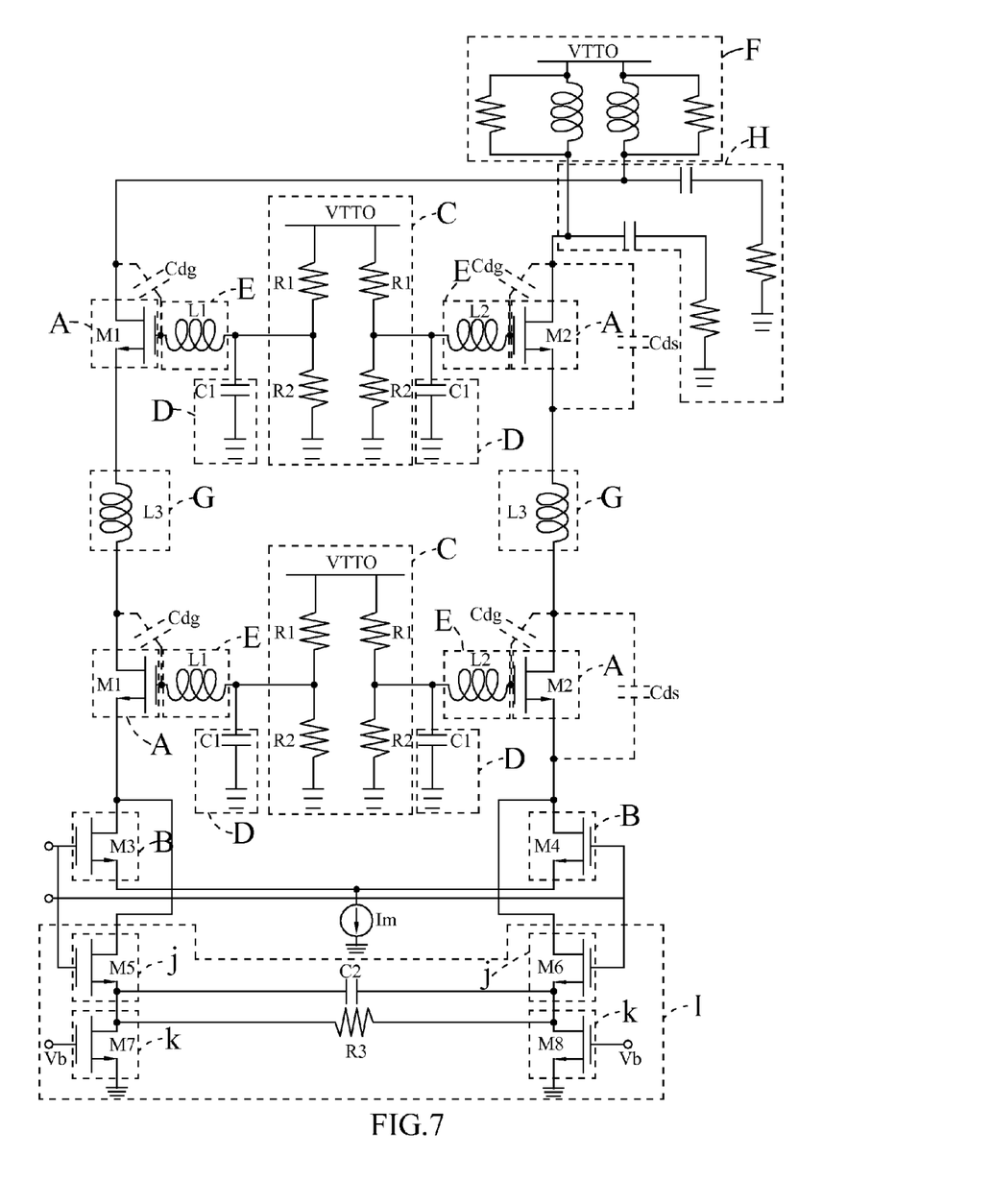
FIG. 7 is a schematic circuit diagram of a bandwidth enhancing equalizer of a broadband high output current output stage in accordance with the present invention.

With reference to FIG. 7 for a schematic circuit diagram of a bandwidth enhancing equalizer of a broadband high output current output stage in accordance with the present invention, the bandwidth enhancing equalizer may be an equalizer circuit I, including a fourth differential pair j, a filth differential pair k, a capacitor C2 and a resistor R3, wherein the fourth differential pair j comprises a fin transistor M5 and a sixth transistor M6, and the fifth differential pair k comprises a seventh transistor M7 and an eighth transistor M8.

A fifth gate of the fifth transistor M5 is connected to a third gate of the third transistor M3, and a sixth gate of the sixth transistor M6 is connected to a fourth gate of the fourth transistor M4. In addition, a fifth drain of the fifth transistor M5 is connected to a third drain of the third transistor M3, and a sixth drain of the sixth transistor M6 is connected to a fourth drain of the fourth transistor M4, and an end of the capacitor C2 is connected to a fifth source of the fifth transistor M5, and another end of the capacitor C2 is connected to a sixth source of the sixth transistor M6.

A fifth source of the fifth transistor M5 is connected to a seventh drain of the seventh transistor M7, and a seventh gate of the seventh transistor M7 is connected to a terminal of another voltage source, and a sixth source of the sixth transistor M6 is connected to a eighth drain of the eighth transistor M8, and a eighth gate of the eighth transistor M8 is connected to another terminal of another voltage source. In addition, one end of the resistor R3 is connected to a seventh drain of the seventh transistor M7, and another end of the resistor R3 is connected to a eighth drain of the eighth transistor M8. The seventh source of the seventh transistor M7 and the eight source of the eighth transistor M8 are connected to the ground. Therefore, a high frequency gain and its linearity of the circuit can be adjusted.

Figure 8:
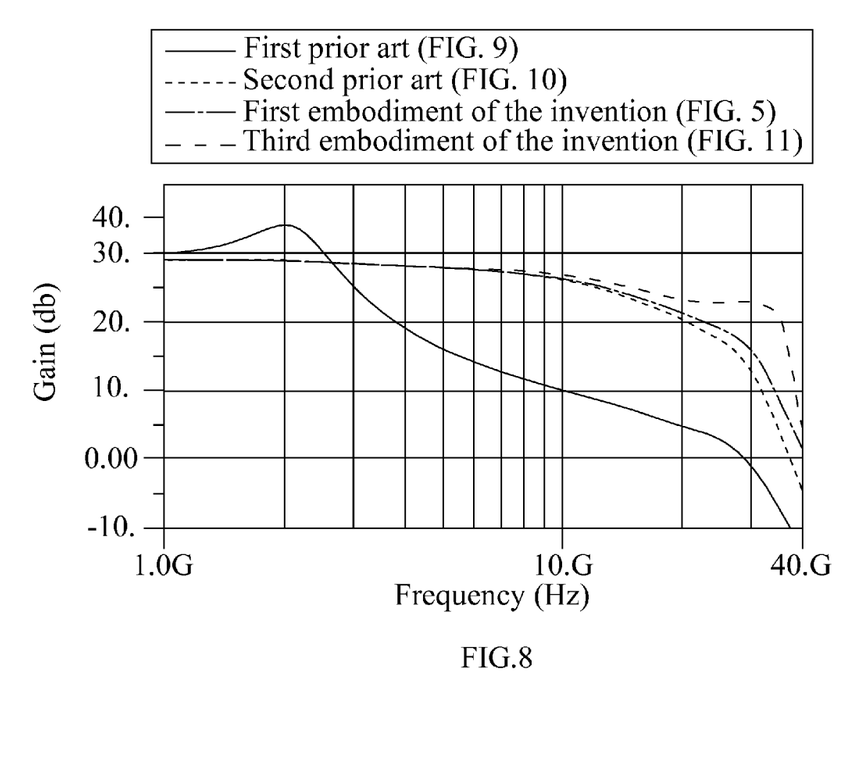
FIG. 8 is a graph of gain (dB) versus frequency (Hz) comparing the bandwidths of broadband high output current output stages between a first preferred embodiment and a third preferred embodiment in of the present invention with the first prior art and second prior art.
Figure 9:
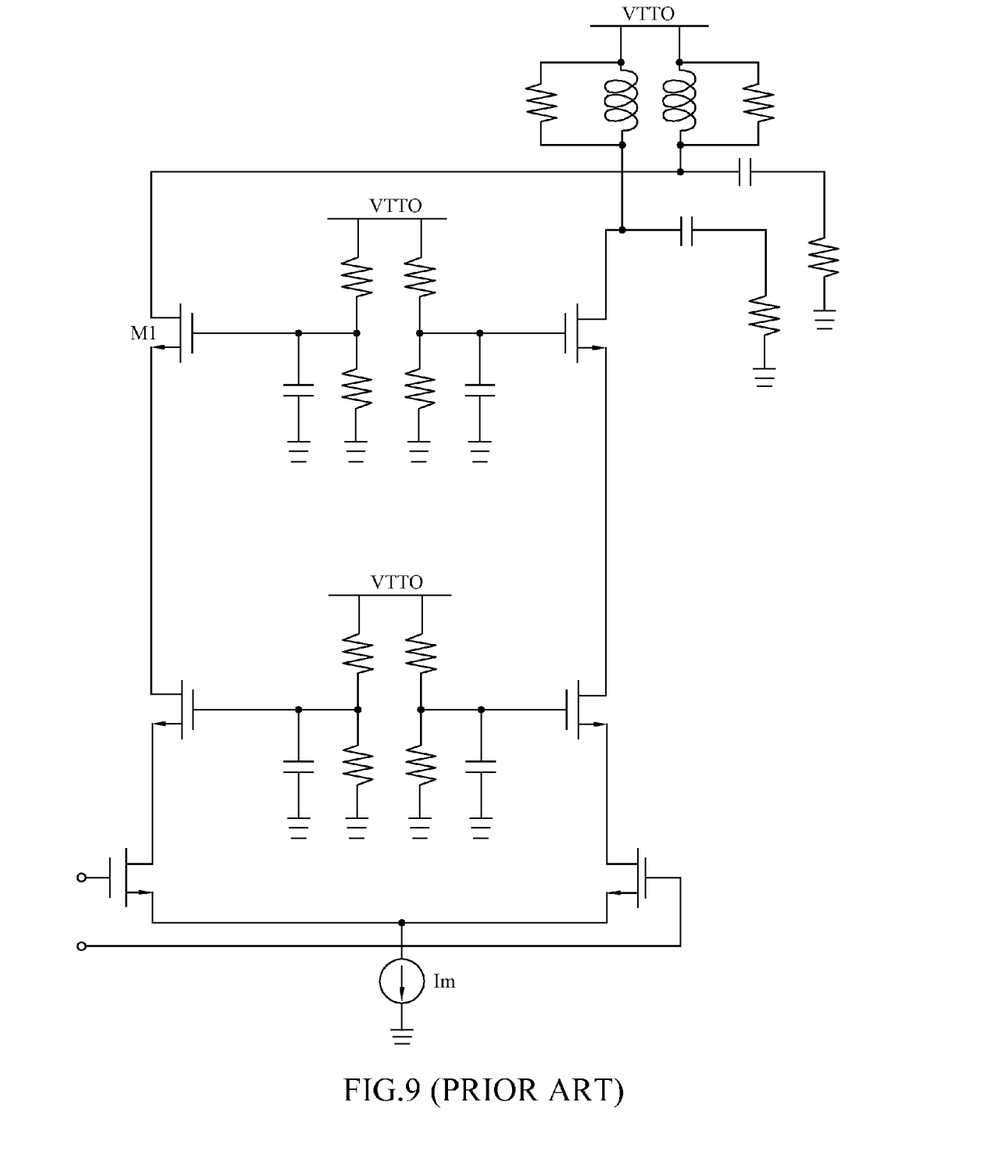
FIG. 9 is a schematic circuit diagram of a output stage of a first prior art.
Figure 10:
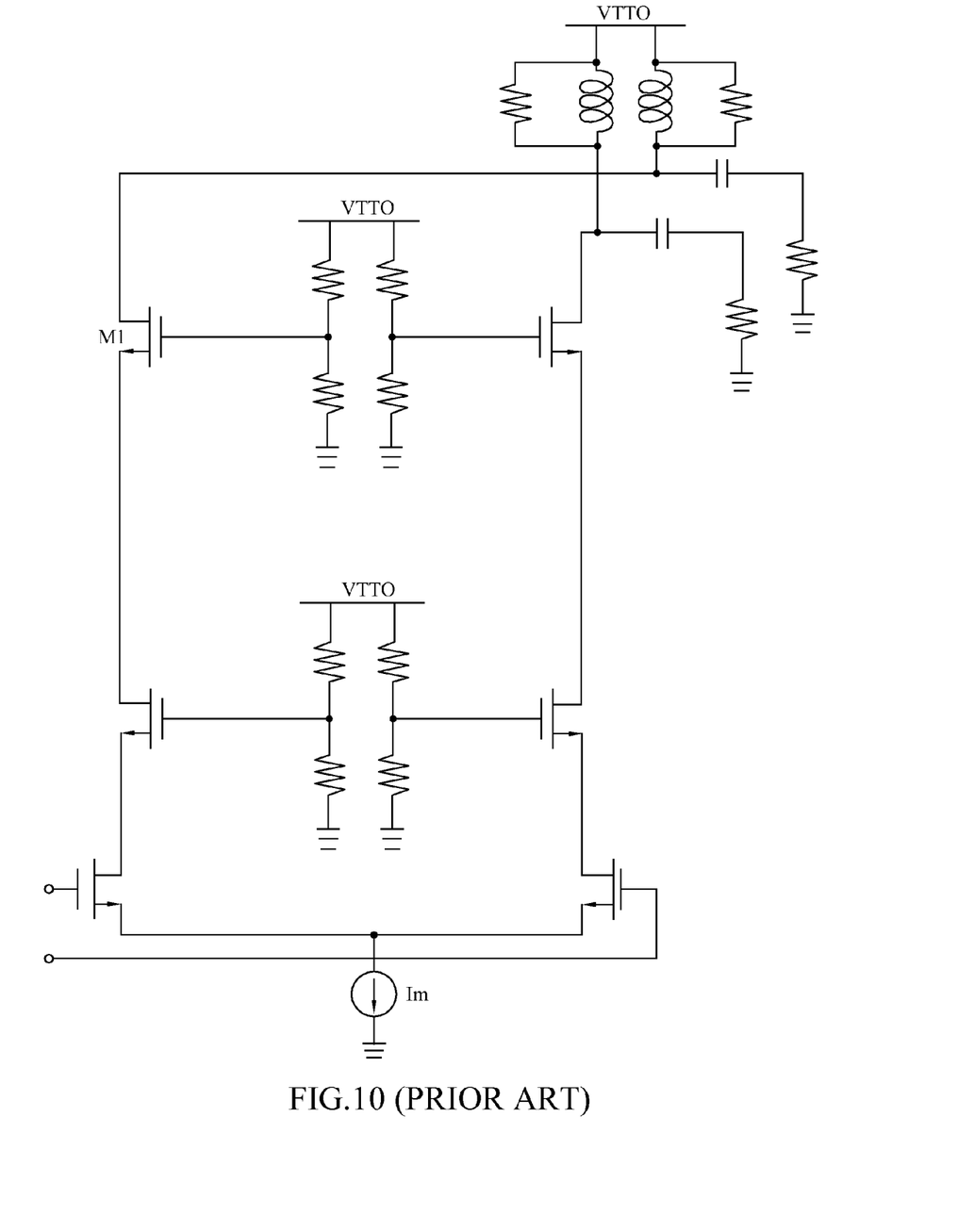
FIG. 10 is a schematic circuit diagram of a output stage of a second prior art.
Figure 11:
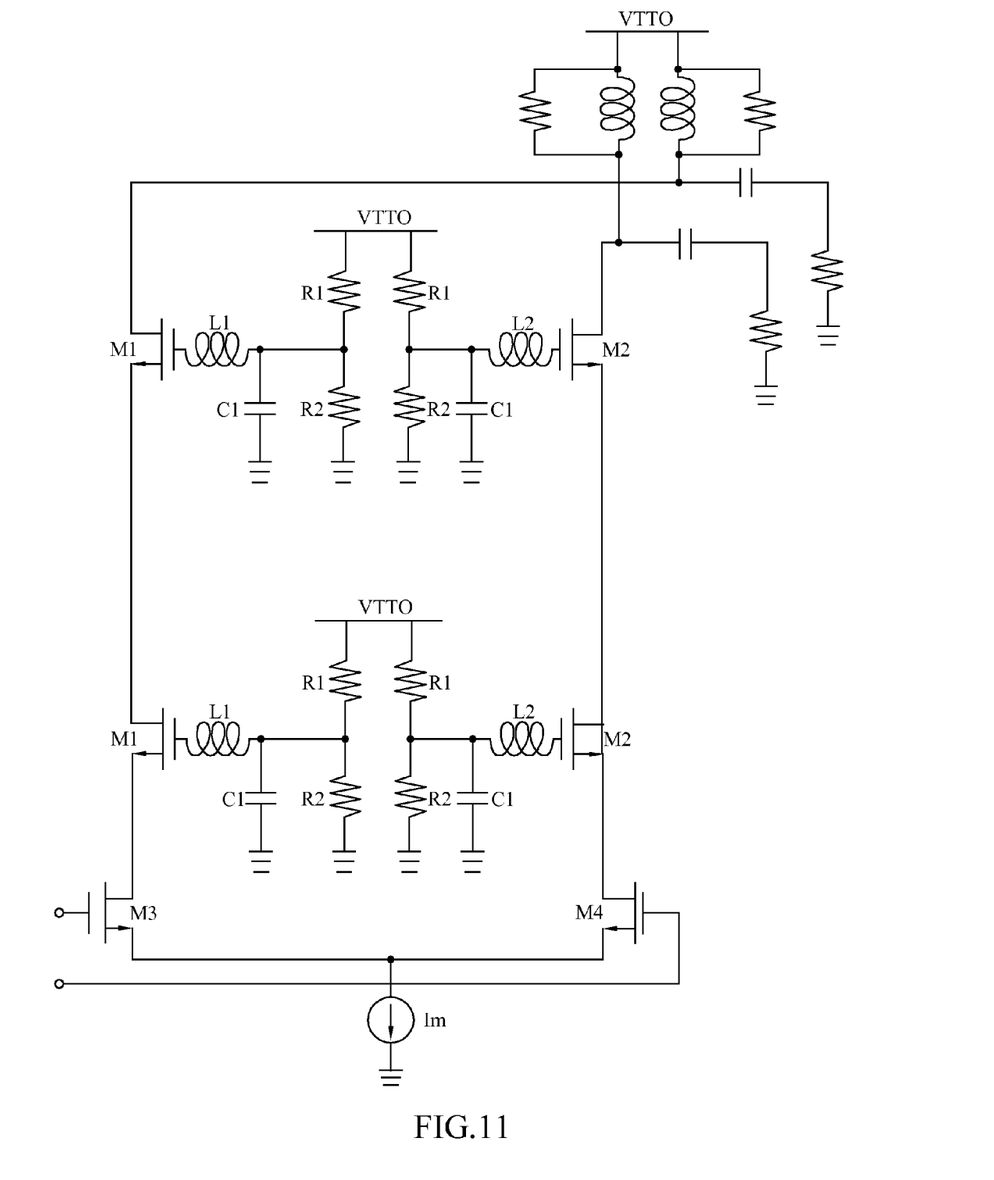
FIG. 11 is a schematic circuit diagram of a broadband high output current output stage in accordance with a third preferred embodiment of the present invention.

With reference to FIG. 8 for a graph of gain (dB) versus frequency (Hz) comparing the bandwidths of broadband high output current output stages between a first preferred embodiment and a third preferred embodiment of the present invention with the first prior art and second prior art, each curve from the bottom to the top sequentially shows a first prior art and a second prior art (as shown in FIGS. 9 and 10, and whose circuit connection method will not be described here again), a third preferred embodiment (as shown in FIG. 11) and a first preferred embodiment (as shown in FIG. 5) of the present invention, wherein the circuit illustrated in FIG. 11 is substantially similar to the circuit illustrated in FIG. 5, and the difference resides on the second compensation unit G only, which will not be described here again. In the figures, the bandwidth of the prior art cannot reach the bandwidth of 40 Gb/S, and the first differential pair A, first compensation unit E and feedback unit D and second compensation unit G in the circuit of each preferred embodiment of the present invention increases the bandwidth of the circuit to approximately 40 Gb/S; therefore the present invention can achieve the effect of increasing the bandwidth.

While the invention has been described by means of specific embodiments, numerous modifications and variations could be made thereto by those skilled in the art without departing from the scope and spirit of the invention set forth in the claims.

What is claimed is:

1. A broadband high output current output stage, comprising:
    a first differential pair connected to a load and capable of enhancing a bandwidth;
    a second differential pair connected to the first differential pair for providing a high current output;
    a first compensation unit connected to the first differential pair;
    a bias unit connected to the first compensation unit for providing a bias to the first differential pair; and
    a feedback unit disposed between the bias unit and the first differential pair for transmitting a portion of output signals back to the first differential pair, while the first compensation unit compensating an electric characteristic of a high frequency zero between the bias unit and the feedback unit.

2. The broadband high output current output stage of claim 1, wherein the first differential pair comprises:
    a first transistor having a first drain and a first source, and the first drain of the first transistor being connected to a first terminal of the load, and the first source of the first transistor being connected to the second differential pair; and
    a second transistor having a second drain and a second source, and the second drain of the second transistor being connected to a second terminal of the load, the second source of the second transistor being connected to the second differential pair;
    thereby a first gate of the first transistor and a second gate of the second transistor are connected to the bias unit through the first compensation unit to form a common gate.

3. The broadband high output current output stage of claim 2, wherein the second differential pair comprises:
    a third transistor having a third gate and the third gate of the third transistor being connected to a pre-driver; and
    a fourth transistor having a fourth gate and a fourth source, the fourth gate of the fourth transistor being connected to the pre-driver, and the fourth source of the fourth transistor being connected to a third source of the third transistor to form a common source;
    wherein a third drain of the third transistor is connected to the first source of the first transistor, and a fourth drain of the fourth transistor is connected to the second source of the second transistor.

4. The broadband high output current output stage of claim 3, wherein the bias unit comprises:
    two pairs of a first resistor and a second resistor serially connected with one another;
    wherein one end of each first resistor is connected to one terminal of a voltage source, and one end of each second resistor is connected to a ground.

5. The broadband high output current output stage of claim 4, wherein the first compensation unit comprises:
    a first inductor having a first end and a second end and the first end of the first inductor being connected to the first gate of the first transistor, and the second end of the first inductor being connected to a first connection point where a first pair of the two pairs of the first resistor and the second resistor being connected; and
    a second inductor having a third end and a fourth end and the third end of the second inductor being connected to the second gate of the second transistor, and the fourth end of the second inductor being connected to a second connection point where a second pair of the two pairs of the first resistor and second resistor being connected.

6. The broadband high output current output stage of claim 5, wherein the feedback unit is a capacitor, and a parasitic capacitor is generated according to an electric characteristic through the first transistor and the second transistor, and a feedback path is provided with the parasitic capacitor and the capacitor.

7. The broadband high output current output stage of claim 3, wherein the bias unit comprises:
    two pairs of a first resistor and a second resistor serially connected with one another;
    wherein one end of each first resistor is connected to the first drain of the first transistor or the second drain of the second transistor, and one end of each second resistor is connected to a ground.

8. The broadband high output current output stage of claim 7, wherein the first compensation unit comprises:
    a first inductor having a first end and a second end and the first end of the first inductor being connected to the first gate of the first transistor, and the second end of the first inductor being connected to a first connection point where a first pair of the two pairs of the first resistor and the second resistor being connected; and
    a second inductor having a third end and a fourth end and the third end of the second inductor being connected to the second gate of the second transistor, and the fourth end of the second inductor being connected to a second connection point where a second pair of the two pairs of the first resistor and second resistor being connected.

9. The broadband high output current output stage of claim 8, wherein the feedback unit is a capacitor, and a parasitic capacitor is generated according to an electric characteristic through the first transistor and the second transistor, and a feedback path is provided with the parasitic capacitor and the capacitor.

10. A broadband high output current output stage, comprising:
    a plurality of first differential pairs stacked with each other sequentially, and a uppermost differential pair of the plurality of first differential pairs being connected to a load and capable of enhancing a bandwidth;
    a second differential pair connected to a lowermost differential pair of the plurality of first differential pairs, and the second differential pair being connected to a pre-driver for providing a high current output;
    a plurality of first compensation units connected to each of the first differential pairs respectively;
    a plurality of bias units, each of the plurality of bias units being connected to each of the plurality of first compensation units for providing a bias voltage to the plurality of first differential pairs through the plurality of first compensation units;
    a plurality of feedback units, each of the plurality of feedback units being disposed between each of the bias units and each of the first differential pairs, while each of the first compensation units compensating an electric characteristic of a high frequency zero between each of the plurality of bias units and the plurality of feedback units respectively; and a plurality of second compensation units, each of the plurality of second compensation units being disposed at a stack position where each of the plurality of first differential pairs being stacked for compensating an electric characteristic of a high frequency zero.

11. The broadband high output current output stage of claim 10, wherein each of the plurality of first differential pairs comprises:
   a first transistor; and
   a second transistor;
   wherein a first drain of the first transistor of the uppermost differential pair is connected to a first terminal of the load, and a second drain of the second transistor of the uppermost differential pair is connected to a second terminal of the load;
   a first source of the first transistor of a lowermost differential pair of the plurality of the first differential pairs and a second source of the second transistor of the lowermost differential pair are connected to the second differential pair respectively;
   each of the plurality of second compensation units is disposed between each first transistor of the first differential pairs and between each second transistor of the first differential pairs; and
   a first gate of the first transistor and a second gate of the second transistor being connected to each of the plurality of the bias units through each of the first compensation units to form a common gate.

12. The broadband high output current output stage of claim 11, wherein the second differential pair comprises:
   a third transistor having a third gate and the third gate of the third transistor being connected to a pre-driver; and
   a fourth transistor having a fourth gate and a fourth source, the fourth gate of the fourth transistor being connected to the pre-driver, and the fourth source of the fourth transistor being connected to a third source of the third transistor;
   wherein the third source of the third transistor and the fourth source of the fourth transistor are connected to form a common source, and a third drain of the third transistor is connected to a first source of the first transistor of the lowermost differential pair, and a fourth drain of the fourth transistor is connected to a second source of the second transistor of the lowermost differential pair.

13. The broadband high output current output stage of claim 12, wherein each bias unit comprises:
   two pairs of a first resistor and a second resistor serially connected with one another;
   wherein one end of each first resistor is connected to one terminal of a voltage source, and one end of each second resistor are connected to a ground.

14. The broadband high output current output stage of claim 13, wherein each of the first compensation unit comprises:
   a first inductor having a first end and a second end, and the first end of the first inductor being connected to the first gate of the first transistor, and the second end of the first inductor being connected to a first connection point where a first pair of the two of the first resistor and the second resistor being connected; and
   a second inductor having a third end and a fourth end, and the third end of the second inductor being connected to a second gate of the second transistor, and the fourth end of the second inductor being connected to a second connection point where a second pair of the two pairs of the first resistor and second resistor being connected.

15. The broadband high output current output stage of claim 14, wherein each feedback unit is a first capacitor, and a first parasitic capacitor is generated according to an electric characteristic through the first transistor and the second transistor, and a feedback path is provided with the parasitic capacitor and the first capacitor.

16. The broadband high output current output stage of claim 12, wherein each bias unit comprises:
   two pairs of a first resistor and a second resistor serially connected with one another;
   wherein one end of the first resistor is connected to the first drain of the first transistor or the second drain of the second transistor, and one end of the each second resistor are connected to a ground.

17. The broadband high output current output stage of claim 16, wherein each of the first compensation unit comprises:
   a first inductor having a first end and a second end, and the first end of the first inductor being connected to the first gate of the first transistor, and the second end of the first inductor being connected to a first connection point where a first pair of the two of the first resistor and the second resistor being connected; and
   a second inductor having a third end and a fourth end, and the third end of the second inductor being connected to a second gate of the second transistor, and the fourth end of the second inductor being connected to a second connection point where a second pair of the two pairs of the first resistor and second resistor being connected.

18. The broadband high output current output stage of claim 17, wherein each feedback unit is a first capacitor, and a first parasitic capacitor is generated according to an electric characteristic through the first transistor and the second transistor, and a feedback path is provided with the parasitic capacitor and the first capacitor.

* * * * *